(12) United States Patent
Liu

(10) Patent No.: US 8,216,375 B2
(45) Date of Patent: Jul. 10, 2012

(54) SLAB CROSS FLOW CVD REACTOR

(75) Inventor: Heng Liu, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 455 days.

(21) Appl. No.: 11/740,736

(22) Filed: Apr. 26, 2007

(65) Prior Publication Data

US 2007/0209589 A1     Sep. 13, 2007

Related U.S. Application Data

(63) Continuation-in-part of application No. 11/064,984, filed on Feb. 23, 2005, now abandoned.

(51) Int. Cl.
*C23C 16/00*     (2006.01)
(52) U.S. Cl. .................... 118/715; 118/718
(58) Field of Classification Search ............ 118/715
See application file for complete search history.

(56) References Cited

U.S. PATENT DOCUMENTS

| | | | |
|---|---|---|---|
| 3,757,733 | A | 9/1973 | Reinberg |
| 4,798,166 | A | 1/1989 | Hirooka et al. |
| 4,812,331 | A | 3/1989 | Hirooka et al. |
| 4,961,399 | A | 10/1990 | Frijilink |
| 4,980,204 | A | 12/1990 | Fuji et al. |
| 5,027,746 | A | 7/1991 | Frijlink |
| 5,281,295 | A | 1/1994 | Maeda et al. |
| 5,334,277 | A | 8/1994 | Nakamura |
| 5,453,124 | A | 9/1995 | Moslehi et al. |
| 5,458,724 | A | 10/1995 | Syverson et al. |
| 5,496,408 | A | 3/1996 | Motoda |
| 5,595,606 | A | 1/1997 | Fujikawa et al. |
| 5,596,606 | A | 1/1997 | Montreuil |
| 5,653,808 | A | 8/1997 | MacLeish et al. |
| 5,788,777 | A | 8/1998 | Burk |
| 5,851,589 | A * | 12/1998 | Nakayama et al. ........ 427/248.1 |
| 5,976,260 | A | 11/1999 | Kinoshita |
| 5,976,261 | A | 11/1999 | Moslehi |
| 6,080,241 | A | 6/2000 | Li et al. |
| 6,090,211 | A | 7/2000 | Kamei |

(Continued)

FOREIGN PATENT DOCUMENTS

JP     62211914     9/1987

(Continued)

OTHER PUBLICATIONS

H. Jürgensen et al., "MOCVD Equipment for Recent Developments Towards the Blue and Green Solid State Laser", MRS Internet Journal of Nitride Semiconductor Research, vol. 1, Article 26, published 1996.

(Continued)

*Primary Examiner* — Keath Chen
(74) *Attorney, Agent, or Firm* — Pavel Kalousek

(57) ABSTRACT

A method and system for performing chemical vapor deposition are disclosed. A chemical vapor deposition reactor can have a generally rectangular chamber that is configured for cross flow and/or zone flow control of reactant gases therethrough. One reactant gas can be injected into the chamber from one end thereof to create cross flow. Another reactant gas can be injected through the top of the chamber. Inert gas can be injected into the chamber to enhance flow control. By providing cross flow and zone flow control, more uniform deposition can be obtained. Also, parameters such as gas flows are less coupled to one another and can therefore be more easily controlled.

25 Claims, 5 Drawing Sheets

U.S. PATENT DOCUMENTS

| | | | |
|---|---|---|---|
| 6,113,705 | A | 9/2000 | Ohashi et al. |
| 6,113,984 | A | 9/2000 | Macleish et al. |
| 6,143,077 | A | 11/2000 | Ikeda et al. |
| 6,165,311 | A | 12/2000 | Collins et al. |
| 6,197,121 | B1 | 3/2001 | Gurary et al. |
| 6,348,099 | B1 | 2/2002 | Xia |
| 6,465,043 | B1 | 10/2002 | Gupta |
| 6,475,286 | B1 | 11/2002 | Frijlink |
| 6,591,850 | B2 | 7/2003 | Rocha-Alvarez |
| 6,630,053 | B2 | 10/2003 | Yamagishi |
| 6,764,546 | B2 | 7/2004 | Raaijmakers |
| 6,812,157 | B1 | 11/2004 | Gadgil |
| 6,843,882 | B2 | 1/2005 | Janakiraman et al. |
| 6,980,204 | B1 | 12/2005 | Hawkins |
| 2001/0007244 | A1 | 7/2001 | Matsuse |
| 2001/0016157 | A1 | 8/2001 | Sundar |
| 2002/0036065 | A1 | 3/2002 | Yamagishi et al. |
| 2002/0054745 | A1 | 5/2002 | Van de Walle et al. |
| 2003/0005886 | A1 | 1/2003 | Park et al. |
| 2003/0005958 | A1 | 1/2003 | Rocha-Alvarez et al. |
| 2003/0075273 | A1* | 4/2003 | Kilpela et al. ............ 156/345.33 |
| 2003/0094903 | A1 | 5/2003 | Tao et al. |
| 2003/0133854 | A1 | 7/2003 | Tabata et al. |
| 2003/0150560 | A1* | 8/2003 | Kinnard et al. .......... 156/345.33 |
| 2003/0213436 | A1 | 11/2003 | Kwon |
| 2003/0221624 | A1 | 12/2003 | Jurgensen |
| 2004/0050325 | A1* | 3/2004 | Samoilov et al. .............. 118/715 |
| 2004/0089235 | A1 | 5/2004 | Yamada |
| 2004/0099213 | A1 | 5/2004 | Adomaitis et al. |
| 2004/0216668 | A1 | 11/2004 | Lindfors et al. |
| 2005/0011436 | A1 | 1/2005 | Liu |
| 2005/0109280 | A1* | 5/2005 | Chen et al. .................... 118/724 |
| 2005/0178336 | A1 | 8/2005 | Liu |
| 2008/0057197 | A1 | 3/2008 | Liu |
| 2009/0126631 | A1 | 5/2009 | Liu |
| 2010/0068381 | A1 | 3/2010 | Liu |

FOREIGN PATENT DOCUMENTS

| | | |
|---|---|---|
| JP | 03-263818 | 11/1991 |
| JP | 1992-209794 | 7/1992 |
| JP | 1995-111244 | 1/1995 |
| JP | 07-111244 | 4/1995 |
| JP | 1998-12554 | 1/1998 |
| JP | 1998-158843 | 6/1998 |
| JP | 2002-110567 | 4/2002 |
| JP | 2003-309075 | 10/2003 |
| WO | WO 92/05577 | 4/1992 |
| WO | WO 99/36587 | 7/1999 |
| WO | 0218672 A1 | 3/2002 |
| WO | WO 02/18672 | 3/2002 |
| WO | WO 2005/010227 | 2/2005 |

OTHER PUBLICATIONS

Thomas Swan, "CVD Reactor", Source Unknown, Date of publication predates date of application filing.

Aixtron of Germany, "Planetary Reactor" Source Unknown, Date of publication predates date of application filing.

J. Dai, "Atmospheric Pressure MOCVD Growth of High-Quality ZnO Films on Al 0 Templates", Journal of Crystal Growth 283 (2005), pp. 93-99.

U.S. Appl. No. 12/699,693, filed Feb. 3, 2010, Heng Liu.

H. Jurgensen, et al., "MOCVD Equipment for Recent Developments Towards the Blue and Green Solid State Laser", MRS Internet Journal of Nitride Semiconductor Research, vol. 1, Article 26, 1996.

Woelk, "Metalorganic Vapor Phase Epitaxy for Specialty Semiconductor Devices", Source Unknown, Date of publication predates date of application.

U.S. Appl. No. 10/621,049, filed Jul. 15, 2003, Liu, Heng.

U.S. Appl. No. 12/259,787, filed Oct. 28, 2008, Moshtag, et al.

H. Jürgensen et al, "MOCVD Equipment for Recent Developments Towards the Blue and Green Solid State Laser", MRS Internet Journal of Nitride Semiconductor Research, vol. 1, Article 26, published 1996.

J. Dai "Atmospheric pressure MOCVD Growth of high-quality ZnO films on A1 O templates", Journal of Crystal Growth 283 (2005), pp. 93-99.

Theodoropoulos et al. "Design of gas inlets for the growth of gallium nitride by metalorganic vapor phase epitaxy", Journal of Crystal Growth 217 (2000), pp. 65-81.

U.S. Appl. No. 11/064,984, filed Feb. 23, 2005, Heng Liu.

U.S. Appl. No. 11/932,293, filed Oct. 31, 2007, Heng Liu.

U.S. Appl. No. 10/727,746, filed Dec. 3, 2003, Heng Liu.

U.S. Appl. No. 12/273,943, filed Nov. 19, 2008, Heng Liu.

* cited by examiner

SLAB CROSS FLOW CVD REACTOR

RELATED APPLICATION

This patent application is a continuation-in-part (CIP) patent application of co-pending patent application Ser. No. 11/064,984, filed Feb. 23, 2005, now abandoned and entitled CHEMICAL VAPOR DEPOSITION REACTOR HAVING MULTIPLE INLETS, the entire contents of which are hereby incorporated explicitly by reference.

TECHNICAL FIELD

The present invention relates generally to chemical vapor deposition (CVD). The present invention relates more particularly to a slab cross flow reactor for providing enhanced parameter control and enhanced deposition uniformity in chemical vapor deposition processes.

BACKGROUND

Reactors for use in chemical vapor deposition (CVD) are well known. Such reactors are used to deposit material upon a substrate during the manufacturing of light emitting diodes (LEDs).

Although such CVD reactors have proven generally suitable for their intended purposes, they possess inherent deficiencies which detract from their overall effectiveness and desirability. Examples of these problems are discussed below.

The proposed solutions to these problems have, to date, been ineffective in providing a satisfactory remedy. Therefore, it is desirable to provide an enhanced CVD reactor.

BRIEF SUMMARY

A method and system for performing chemical vapor deposition are disclosed. For example, according to a particular embodiment a chemical vapor deposition reactor can comprise a generally rectangular chamber. The generally rectangular chamber can be configured for cross flow and/or zone flow control of reactant gases.

As a further example, according to a particular embodiment a method for performing chemical vapor deposition can comprise placing at least one wafer into a generally rectangular chamber. A reactant gas, e.g., $NH_3$, can be injected into the chamber so as to define a cross flow through the chamber. Another reactant gas, e.g., a group III gas, can be injected into the chamber from above using zone flow control.

Alternatively, the group III gas can be injected into the chamber so as to define a cross flow through the chamber and the $NH_3$ can be injected into the chamber from above using zone flow control. Further, inert gas can be injected into the chamber so as to define a cross flow though the chamber and/or from above using zone control. Any desired combination of group III, $NH_3$, and inert gas can be injected into the chamber so as to define a cross flow though the chamber and/or from above using zone control. Each different gas, e.g., group III, $NH_3$, and inert gas, can be injected into the chamber via a separate set of injectors. Optionally, zone control can be provided at the end of the chamber.

As a further example, according to a particular embodiment a light emitting diode can be formed by placing at least one wafer into a generally rectangular chamber. A reactant gas can be injected into the chamber so as to define a cross flow through the chamber and another reactant gas can be injected into the chamber from above, optionally using zone flow control.

By providing cross flow and/or zone flow control, more uniform deposition can be obtained. Also, parameters such as gas flows are less coupled to one another and are therefore more easily determined and controlled.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
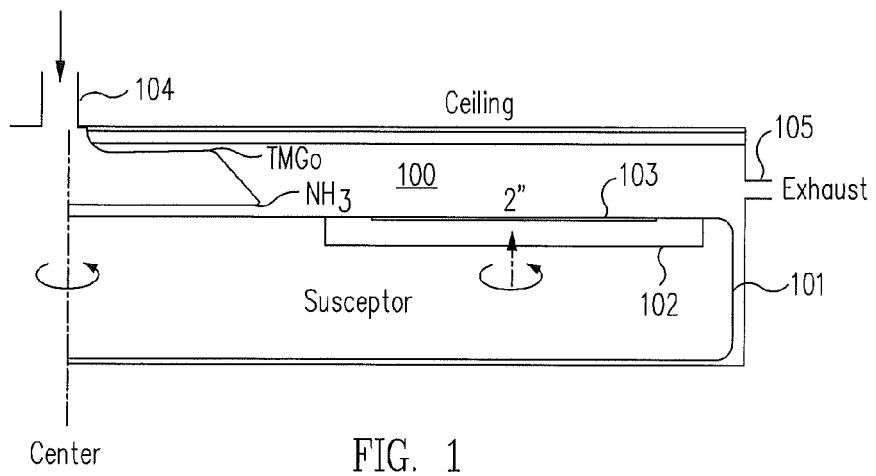
FIG. 1 is a side view of one half of a contemporary chemical vapor deposition (CVD) reactor chamber.

Systems and methods for enhancing the chemical vapor deposition (CVD) process are disclosed herein. More particularly, according to a particular example, a chemical vapor deposition reactor can comprise a generally rectangular chamber. The generally rectangular chamber can be configured for cross flow of reactant gases. The generally rectangular chamber can also be configured to facilitate an introduction of gas through a top thereof.

At least one, typically a plurality, of gas injectors can be formed at a top of the chamber. At least one, typically a plurality, of gas injectors can be formed at one end of the chamber. At least one, typically a plurality, of gas exhausts can be formed at the other end of the chamber.

The gas injectors at the top of the chamber and/or the gas injectors at the end of the chamber can be divided into a plurality of individually controllable zones. Thus, gas flow can be controlled on a zone basis. That is, gas flow though each of the injectors in a particular zone can be collectively controlled. For example, according to such collective control, a single adjustment can affect gas flow through all of the injectors within a zone, while not substantially affecting gas flow through injectors in other zones.

Alternatively, the gas injectors at the top of the chamber and/or the gas injectors at the end of the chamber can be controlled on an individual basis. That is, gas flow through each of the injectors can be individually controlled.

Any desired combination of collective and individual control of the gas injectors can be provided. For example, gas flow through the injectors at the top of the chamber can be controlled on a zone basis and gas flow through the injectors at the end of the chamber can be controlled on an individual basis. As a further example, one or more of the injectors within a zone can be individually controllable. Indeed, one, more than one, or all of the injectors can be subject to both zone and individual control.

As a further example, all of the injectors at the top of the chamber can be considered to be in one zone and can thus be collectively controlled. Similarly, all of the injectors at the end of the chamber can be considered to be in one zone and can be controlled collectively.

Any desired number of zones can be provided. Thus, zero, one, two, three, four, five, or more zones can be provided for the injectors at the top of the chamber and/or for the injectors at the end of the chamber. The injectors at the top of the chamber can have either the same or a different number of zones with respect to the injectors at the end of the chamber.

Each zone can have any desired number of injectors. For example, each zone can have between two and fifty injectors. As a further example, each zone can have approximately twenty injectors. The number of injectors can vary from zone to zone.

Each zone can be of any desired configuration. Each zone does not have to have the same configuration as other zones. For example, the zones can be in the form of longitudinal (in the direction of the cross flow) rows, in the form of transverse (perpendicular to the direction of the cross flow) rows, in a checkerboard pattern, or in the form of concentric circles.

The zones can be reconfigurable. For example, by providing individual control of flow through the nozzles, the zones can be software or otherwise configurable so as to have any desired shape or combination of shapes.

Wafers can be supported within the chamber upon a rotatable wafer carrier. The entire wafer carrier can be rotatable and/or individual satellites of the wafer table can be rotatable.

One problem with contemporary CVD systems is that an undesirably wide process parameter space inherently has to be investigated in an attempt to find the optimum conditions for performing the CVD process. Undesirable interactions often occur between process parameters. That is, there is substantial cross-talk between process parameters. This cross-talk makes the effect of changing a parameter difficult to predictable in contemporary CVD systems because changing one parameter can undesirably effect a corresponding change in one or more other parameters. The magnitude and direction (increased or decreased flow), as well as where (upon which wafers or which portions of the wafers) the effect occurs, can be difficult or impossible to predict.

For example, when there is a desire to increase the group V/III ratio, the increase can be accomplished by increasing the $NH_3$ flow rate while fixing the group III flow rate. However, the group III flow toward the wafers will be affected in a manner that frequently necessitates adjustment of the group III flow rate, as well as the group III distribution. Adjustment of the group III flow rate and distribution are necessary so as to maintain the same deposition or growth uniformity. As such, interaction between the two flow rates is undesirable because it complicates the process optimization procedure.

Figure 2:
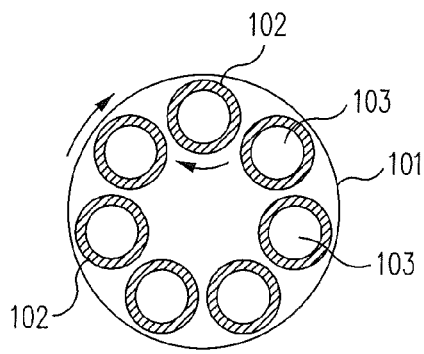
FIG. 2 is a top view of the CVD reactor chamber of FIG. 1, wherein a rotating table thereof is configured to support seven wafers.
Figure 3:
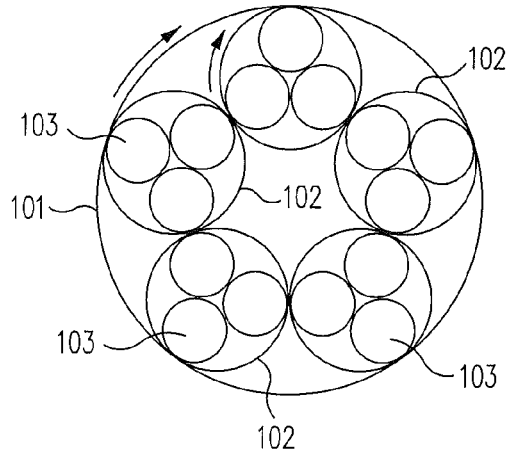
FIG. 3 is a top view of the CVD reactor chamber of FIG. 1, wherein the rotating table thereof has five rotating satellites, each of which is configured to support three wafers.

Referring now to FIGS. 1-3, one type of contemporary reactor is commonly referred to as planetary reactor. This reactor comprises a cylindrical chamber 100 within which chemical vapor deposition is performed. In such planetary reactors, a susceptor or wafer carrier 101 rotates at approximately 10 rpm and the individual wafer pucks or satellites 102 rotate at approximately 50 rpm. One or more wafers 103 rest upon each satellite 102.

Gases enter the chamber via a central injection nozzle 104 that separates group III gases from group V gases prior to their introduction into the chamber 100. The injection nozzle 104 is above the wafer carrier 101. The gases can be trimethylgallium (TMG) and ammonia ($NH_3$), for example. A typical wafer size is 2 inches. The exhaust 105 is also above the wafer carrier 101. A heater (not shown) can be disposed beneath the wafer carrier 101.

With particular reference to FIG. 2, the wafer carrier 101 can be configured to support seven wafers 103 via seven satellites 102. Each satellite 102 supports one wafer 103. Both the wafer carrier 101 and each individual satellite 102 rotate, as shown by the arrows, in an attempt to provide uniform deposition upon the wafers 103.

With particular reference to FIG. 3, the wafer carrier 101 can alternatively be configured to support fifteen wafers 103 via five satellites 102. In this instance, each satellite 102 supports three wafers 103. Both wafer carrier 101 and each individual satellite 102 rotate, as shown by the arrows, in an attempt to provide uniform deposition upon the wafers 103.

However, such planetary reactors suffer from inherent deficiencies that tend to detract from their overall utility and desirability. These deficiencies include the accumulation of heavy deposits on the chamber ceiling due to lack of active gas flow. The deficiencies also include undesirable gas flow changes along the radial flow direction due to increased cross-section, which is an inherent source of deposition non-uniformity in such cylindrical reactors.

Further, the degree of uniformity provided by the averaging effect realized from rotation of the wafer carrier 101 and/or the satellites 102 depends upon the ability to define an optimized zero-rotation deposition profile. The zero-rotation deposition profile can only be roughly controlled by adjusting the TMG and NH3 flow from the center injector. Consequently, control of the deposition profile is not as precise as is desirable.

Figure 4:
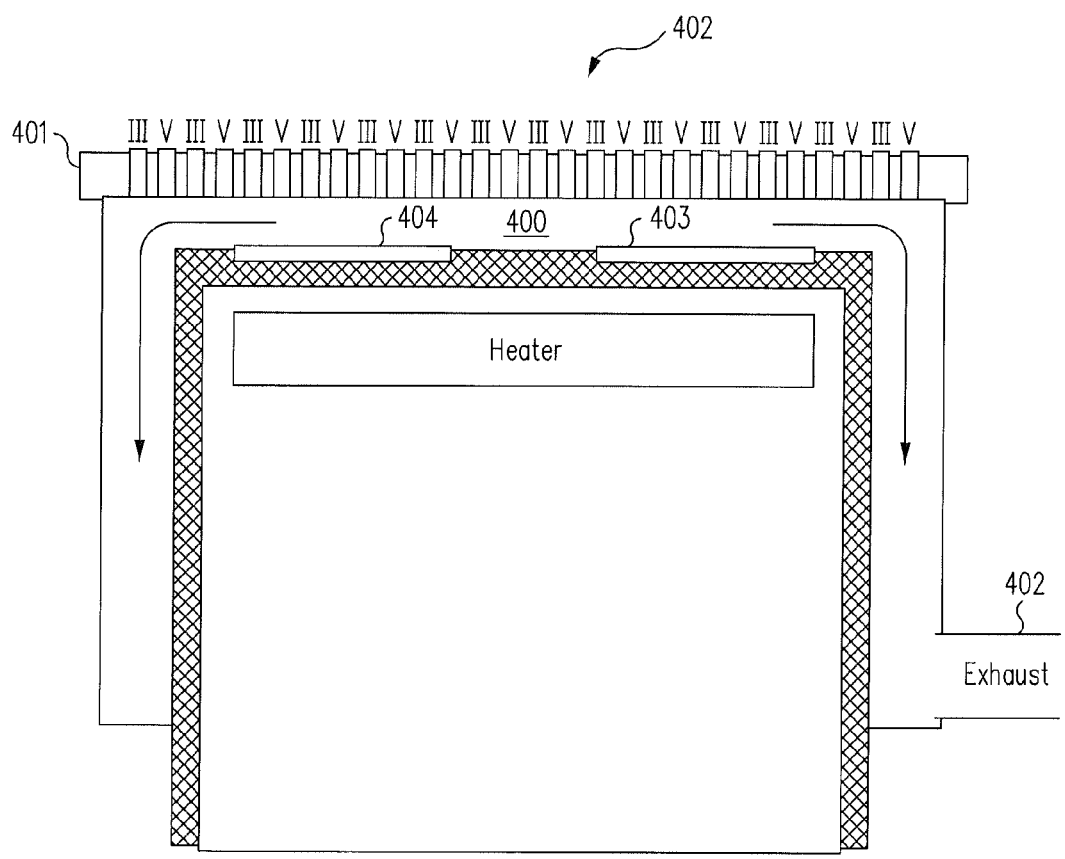
FIG. 4 is a side view of another contemporary chemical vapor deposition (CVD) reactor, wherein the chamber is defined by a narrow flow channel.

Referring now to FIG. 4, another type of contemporary reactor has a cylindrical chamber 400 that defines a narrow flow channel. In this reactor, the group III and group V gases both are distributed over the entire lid 401 via a plurality of group III and group V inlet nozzles or injectors 402. A wafer carrier 403 supports a plurality of wafers 404.

Each group III injector has a group V injector adjacent to it. The exhaust 402 is below the wafer carrier 403. Gases flow from the injectors 402, over the wafers 404, and downwardly toward the exhaust 402. Neither the wafer carrier 403 nor the individual wafers 404 rotate.

However, such multiple injector reactors suffer from inherent deficiencies that tend to detract from their overall utility and desirability. These deficiencies include lack of deposition uniformity. Since neither the wafer carrier 403 nor the wafers 404 rotate, deposition uniformity is solely dependent on group III source distribution. Although the use of multiple injectors in intended to mitigate this problem, poor uniformity still results due to insufficient and erratic flow of the reactant gases, especially at high growth pressure conditions.

Further, cross talk among process parameters inhibits process control and uniformity. For example, modification of the flow of one gas, such as by increasing gas flow through one or more injectors, can result in altered flow of another gas, thus necessitating modification of the flow through one or more injectors for the other gas.

More particularly, such all vertical injection inherently results in undesirable turbulence of the gases. This turbulence inhibits desired uniformity in the flow of the gases, especially at high growth pressure conditions, thus inherently resulting in reduced uniformity of deposition upon the wafers.

Further, thermophoresis causes the formation of particles in the gas phase, which inhibits the group III gases from reaching the substrate surface. This undesirable effect becomes more severe at higher growth pressures. Because of this undesirable effect, growth efficiency decreases with pressure.

A further inherent disadvantage of this contemporary multi-injector configuration, as well as other contemporary cylindrical CVD reactor chambers, is that the gas velocity changes in the outward radial flow direction due to the increasing cross-sectional area of the chamber. To avoid this problem, the gas flow from the ceiling has to be well calculated and controlled, so as to distribute the right amount of gas spatially. Attempting to optimize gas distribution inherently limits deposition process robustness and/or parameter value window by placing constrains upon the suitable gas flows.

Particular embodiments of the slab cross flow CVD reactor provide enhanced deposition control that can, at least to some degree, compensate for the loss of uniformity that occurs according to contemporary practice. Particular embodiments can provide enhanced, e.g., substantially full, coverage of a wafer with more uniform growth. Further, larger diameter wafers can be accommodated without the need to scale up the chamber size, as is necessary when using contemporary CVD reactor chambers.

According to particular embodiments, substantially simpler injector and exhaust construction can be provided. Injector and exhaust construction can be simplified by the use of rectangular chamber geometry, instead of the cylindrical chamber geometry that is used in contemporary CVD reactor chambers.

According to particular embodiments, substantially more uniform gas flow speed is provided throughout the CVD reactor chamber. That is, gas flow speeds across a cross-section of the gas flow (perpendicular to the gas flow direction), as well as along the direction of gas flow, tend to be more constant due to the constant cross-sectional area of the rectangular CVD reactor chamber along the direction of gas flow. The speed of the gases moving along the flow direction will typically be increasing since gas injected from the top adds to the horizontal cross flow. However, such increasing flow can readily be accommodated since the increase is linear with respect to the gas added from the top.

Figure 5:
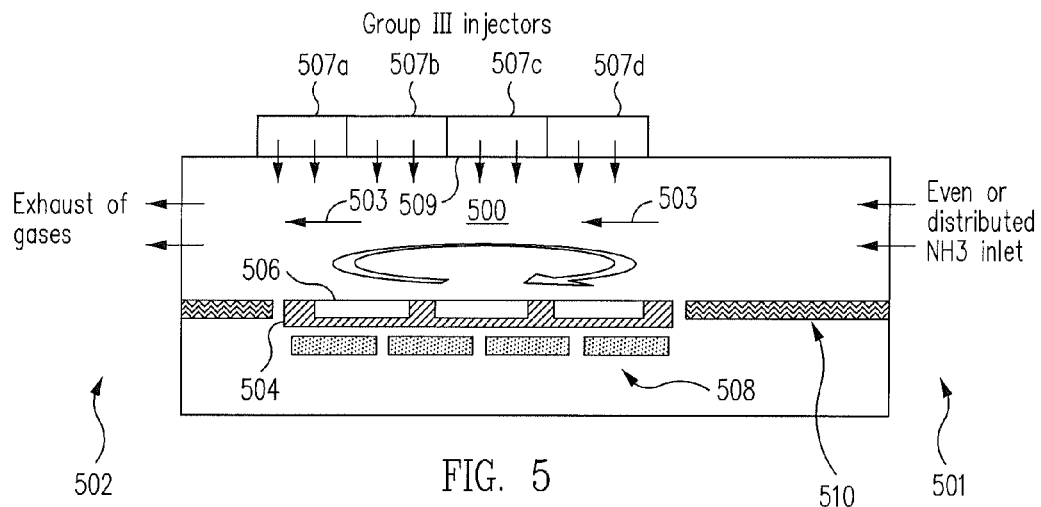
FIG. 5 is a side view of an example of an embodiment of a slab cross flow CVD reactor, wherein $NH_3$ is injected into the chamber so as to define a cross flow through the chamber and group III gas is injected into the chamber from above using zone flow control.
Figure 6:
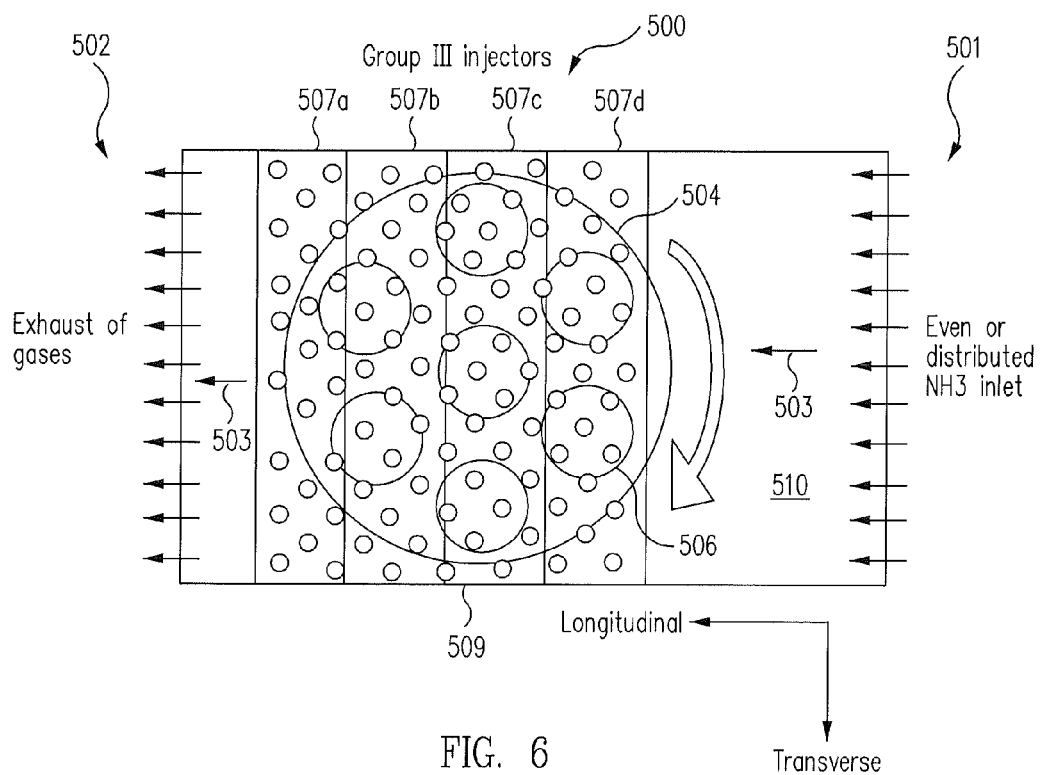
FIG. 6 is a top view of the slab cross flow CVD reactor of FIG. 5, better showing the group III injector zones thereof.

Referring now to FIGS. 5 and 6, an example of an embodiment of a slab cross flow CVD reactor is shown. According to this particular embodiment, $NH_3$ is injected from one side 501 (the right side as shown in FIGS. 5 and 6) of a generally rectangular reaction chamber 500 and flows horizontally therethrough to define cross flow 503.

In the particular embodiment shown in FIGS. 5 and 6, cross flow 503 is along the long or longitudinal direction of the chamber 500. However, a slab cross flow CVD reactor can alternatively be configured such that cross flow is along the short or transverse direction of the chamber.

The $NH_3$ cross flow 503 can be evenly or unevenly distributed. Individual and/or zone control of the $NH_3$ gas injectors at the end of the chamber 500 facilitates distribution of the $NH_3$ as desired.

One notable advantage of the slab cross flow CVD reactor is that the gas flow speed in the flow direction can be kept constant because the cross-sectional area of the chamber is not changing substantially along the gas flow direction. The cross-section area of the chamber is equal to the height of the chamber multiplied by the width of the chamber, which remain substantially unchanged along the entire cross flow gas path (from the end injectors 501 to the exhausts 502). Again, the speed of the gases moving along the flow direction will typically be increasing since gas injected from the top adds to the horizontal cross flow. However, such increasing flow can readily be accommodated since the increase is linear with respect to the gas added from the top.

This is in contrast to the contemporary cylindrical design discussed above, in which $NH_3$ gas flow radially inherently results in slowing gas speed because the cross-sectional area in the flow direction of the chamber inherently increases as the gas moves radially outward.

A rotating wafer carrier 504 can support a plurality of wafers 506 beneath a plurality of group III injection zones 507a-507d. The wafers 506 can be supported upon satellites that facilitate the rotation of the wafers, such as while the wafer carrier 504 is also rotating. Each satellite can support one or more wafers. However, one advantage of the slab cross flow CVD reactor is a mitigated need to use such satellites, thus simplifying construction and reducing costs. Optionally, satellite rotation can be provided so as to achieve even greater uniformity. Of course, adding satellite rotation increases the complexity of the hardware design.

The wafer carrier 504 can be constructed, for example, from graphite. The wafer carrier 504 can have a protective coating, such as a coating of silicon carbide SiC.

According to particular embodiments, more than one wafer carrier can be provided within a chamber. A plurality of wafer carriers can be provided in a row along the direction of cross flow and/or perpendicular to the direction of cross flow.

The temperature of the wafers during processing can be controlled by a heater assembly 508, which can be disposed beneath wafer carrier 504. The elements of heater assembly 508 can be of the resistive type and can be operated by applying electrical current so as to generate thermal radiation that heats the graphite wafer carrier 504 and therefore the wafers 506 supported thereby. Alternatively, temperature control can be provided by any other desired means.

A floor 510 generally surrounds wafer carrier 504 so as to define a substantially flat surface or slab. The wafer carrier 504 can be configured such that the upper surfaces of the wafers 506 are substantially flush with the floor 510 to further define the slab. The flat surface of the slab tends to minimize undesirable turbulence and thus promotes more uniform cross flow.

Group III gas can be injected from a perforated ceiling 509 having a plurality of individually controllable zones 507a-507d, as discussed above. Since the deposition profile of the resulting film is determined, at least in part, by the distribution of the group III gas impingement upon the wafer's surface, the use of separate zones facilitates better control of film uniformity across the wafer carrier 504.

Rotation of the wafer carrier 504 and/or the individual wafers 506 through the plurality of group III flows coming from above provides a desirable averaging effect during deposition. Rotation of wafer carrier 504 can move wafers 506 through a plurality of zones 507a-507d to enhance such averaging.

Figure 7:
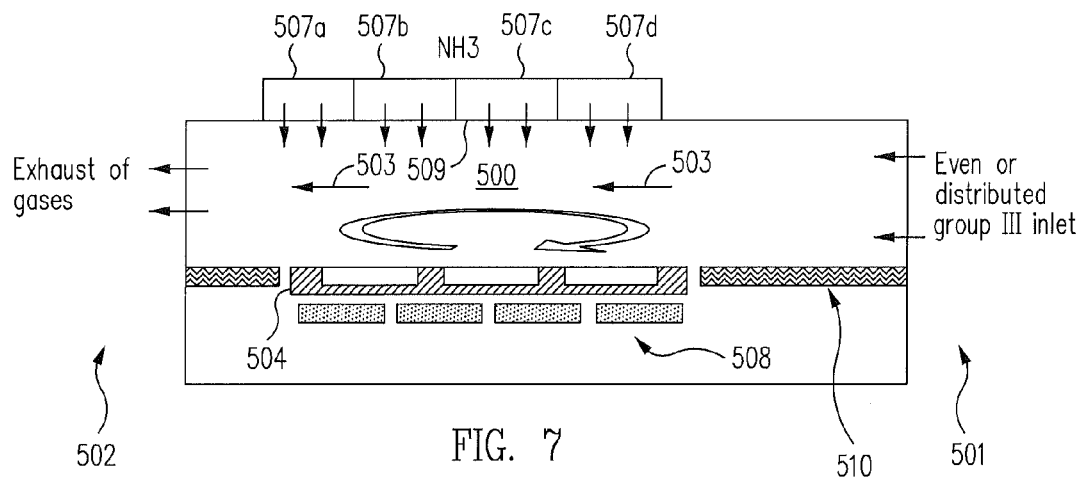
FIG. 7 is a side view of another example of an embodiment of a slab cross flow CVD reactor, wherein group III gas is injected into the chamber so as to define a cross flow through the chamber and $NH_3$ is injected into the chamber from above using zone flow control.
Figure 8:
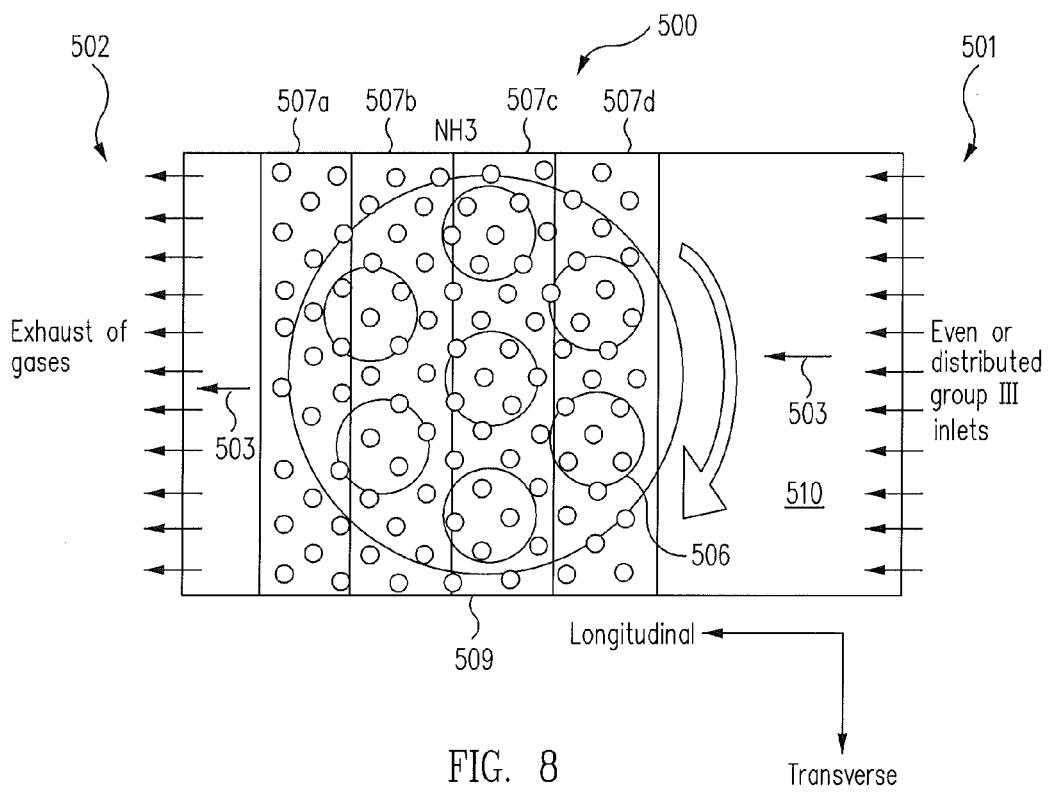
FIG. 8 is a top view of the slab cross flow CVD reactor of FIG. 7, better showing the $NH_3$ injector zones thereof.

Referring now to FIGS. 7 and 8, according to another example of an embodiment of a slab cross flow CVD reactor, the group III gas and the $NH_3$ can be reversed with respect to how there are injected. That is, the group III gas can be injected into the chamber so as to define a cross flow through the chamber and the $NH_3$ can injected into the chamber from above using zone flow control. Group III gas can be injected into the chamber from one end (such as side 501) of the chamber.

Reversing the injection of the group III gas and the $NH_3$ can inhibit parasitic reaction of these with respect to the previously described embodiment. Better separation of the gases prior to reaching the wafers can be achieved.

Figure 9:
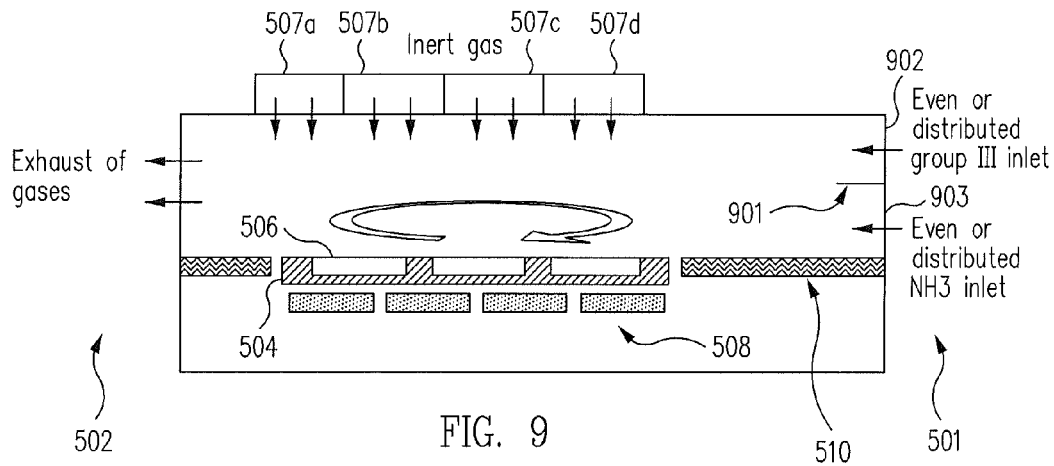
FIG. 9 is a side view of another example of an embodiment of a slab cross flow CVD reactor wherein both $NH_3$ and group III gas are injected into the chamber so as to define a cross flow through the chamber and inert gas is injected into the chamber from above using zone flow control.
Figure 10:
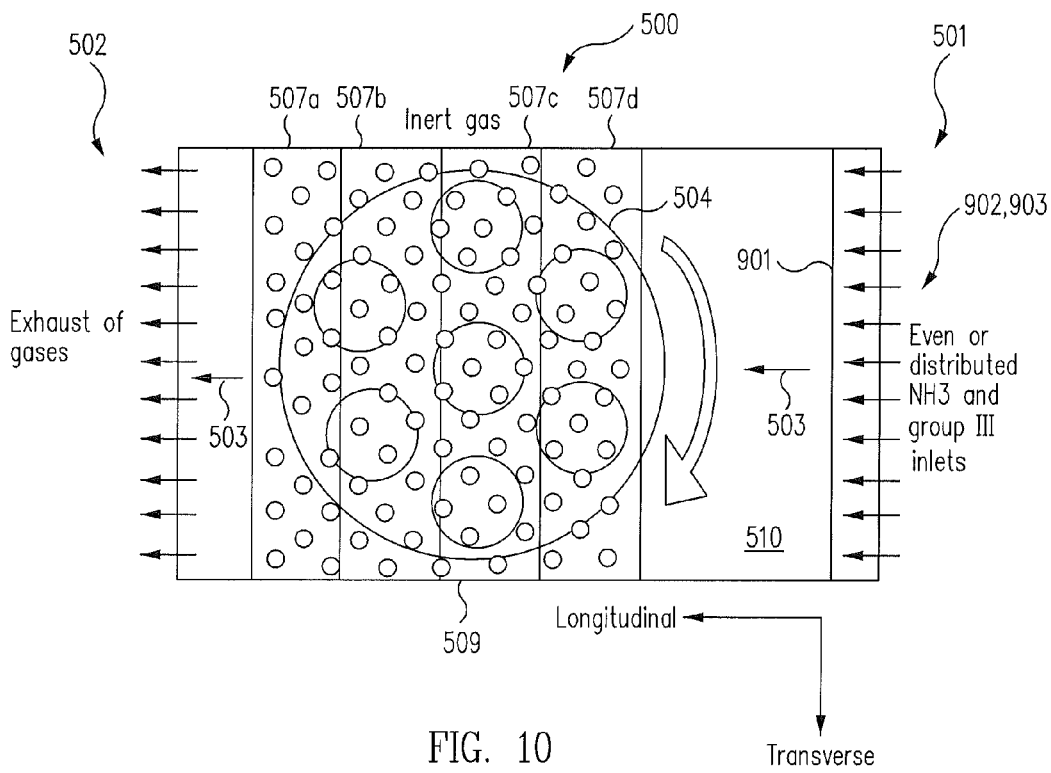
FIG. 10 is a top view of the slab cross flow CVD reactor of FIG. 9, better showing the inert gas injector zones thereof.

Referring now to FIGS. 9 and 10, according to another example of an embodiment of a slab cross flow CVD reactor, both the group III gas and the $NH_3$ can be injected into the chamber so as to define a cross flow through the chamber and inert gas can injected into the chamber from above using zone flow control. Group III gas and $NH_3$ can be injected into the chamber from one end (such as side 501) of the chamber. Separate injectors can be used for the group III gas and the $NH_3$ so as to inhibit premature mixing and reaction thereof.

The inert gas can comprise $N_2$ or $H_2$, for example. Those skilled in the art will appreciate that various other gases and combinations of gases are likewise suitable.

Deposition uniformity can be controlled by varying the flow rates of the group III gas and the $NH_3$. The wafer carriers or satellites can be rotated to further enhance deposition uniformity.

The group III gas injectors and the $NH_3$ injectors can be isolated from one another to further inhibit premature mixing and reaction of these gases. Such isolation can be effected, for example, by a partition 901 that extends from the wall of the chamber where the injectors are located partially into the chamber. The partition 901 prevents the group III gas and the $NH_3$ from mixing until these gases have traveled closer to the wafers. In this manner, parasitic reactions can be inhibited.

A plurality of such partitions (either horizontal as shown or vertical) can be used to effect such separation of the gases. Such partitions can be placed elsewhere within the chamber so as to control gas flow (such as to provide more laminar flow), as desired.

Rather than a mechanical partition, such as partition 901 of FIGS. 9 and 10, inert gas partition can be used to maintain separation of the gases prior to their reaching the wafers. The inert gas can function as a partition. That is, inert gas can be injected between adjacent group III gas and $NH_3$ injectors so as to function as a barrier. For example, a comparatively thin layer of inert gas can be so injected such that the inert gas functions as a barrier between the group III gas and the $NH_3$ proximate the injectors and such that the inert gas dissipates (loses it ability to function as a barrier) as the gases approach the wafers.

The injection of inert gas from the ceiling using zone flow control can inhibit thermal convection so as to provide more efficient and uniform material deposition upon the wafers. The injection of inert gas from the ceiling can also inhibit the undesirable deposition of materials upon the ceiling. This reduces downtime for cleaning and thereby increases throughput. Inhibiting such deposits upon the ceiling also tends to provide enhanced consistence between runs.

For each embodiment, the gas or gases injected from the side, i.e., the gases that provide cross flow, can be either evenly distributed or non-evenly distributed, both horizontally and vertically. The flow distribution, whether even or non-even, can be controlled by even or non-even positioning of the nozzles. For example, the nozzles can be closer together near the ends of a horizontal row than in the middle of the row, so as to provide increased gas flow proximate the side walls of the chamber in a manner that tends to compensate for resistance to flow caused by the side walls. Similarly, the flow distribution can be controlled by the flow rates through the injectors.

Embodiments provide enhanced uniformity of growth over the entire area of a wafer, as opposed to the bands of circles of non-uniform coverage provided by some contemporary chemical vapor deposition systems. Consequently, larger diameter wafers are more readily accommodated without requiring a scale up of the chamber size. Injector and exhaust construction is simplified by the linear, e.g., rectangular, chamber geometry (as opposed to the cylindrical chamber geometer of prior art chambers). The more uniform flow speed provided by the rectangular chamber, which is due at least in part to the substantially constant cross-section thereof, further enhances deposition uniformity.

By enhancing deposition uniformity across the whole wafer carrier 504, particular embodiments facilitate configuration of the carrier to accommodate various numbers of wafers and wafer sizes. Moreover, larger wafer sizes can more readily be accommodated without the need to scale up the chamber size.

According to particular embodiments, a wide process parameter space does not have to be investigated to find the optimum process conditions. Further, undesirable interaction between process parameters is mitigated. Thus, the effect of changing the value of one parameter in a CVD process tends to be more isolated to only the changed parameter and not to other parameters. That is, there is mitigated cross-talk between parameters such as flow rates. Thus, the effect of changing a parameter is substantially more predictable than in contemporary CVD systems.

The slab cross flow chamber of the present invention can provide substantially more uniform deposition of materials as compared to contemporary chemical vapor deposition chambers with reduced trade-offs with other growth attributes such as growth rate, growth pressures, etc. More uniform deposition can result from the combination of cross flow of $NH_3$ and the use of zone or individually controllable group III injectors on the top of the chamber. Turbulence is substantially mitigated, thus resulting in enhanced controllability of processing parameter, such as gas flow rates, and also resulting in more uniform deposition, particular under higher growth pressure conditions. More uniform deposition and enhance parameter control tend to result in improved yield.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A chemical vapor deposition reactor comprising:
a deposition chamber having a generally rectangular cross-section;
a plurality of first gas injectors coupled at a first side of the deposition chamber, the first gas injectors providing a first gas into the chamber;
at least one exhaust coupled at a second side of the deposition chamber, the second side being opposite the first side, the at least one exhaust providing a controlled flow path for the first gas;

a rotatable wafer carrier coupled to a third side of the deposition chamber; and a plurality of second gas injectors coupled to a fourth side of the deposition chamber and providing a second gas into the chamber, the fourth side being opposite the third side, wherein the plurality of second gas injectors are grouped into a plurality of zones arranged in rows; and each of the zones are individually controllable.

2. The chemical vapor deposition reactor as recited in claim 1, further comprising a plurality of perforations in the fourth side of the chamber, the plurality of second gas injectors providing the second gas into the chamber through the perforations.

3. The chemical vapor deposition reactor as recited in claim 1, wherein the first gas comprises a group III gas.

4. The chemical vapor deposition reactor as recited in claim 3, wherein the second gas comprises NH3.

5. The chemical vapor deposition reactor as recited in claim 1, wherein the first and second sides of the chamber correspond to the horizontal ends of the chamber, and the third and fourth sides of the chamber correspond to the vertical ends of the chamber.

6. The chemical vapor deposition reactor as recited in claim 1, wherein the second gas comprises a group III gas.

7. The chemical vapor deposition reactor as recited in claim 6, wherein the first gas comprises NH3.

8. The chemical vapor deposition reactor as recited in claim 1, wherein the plurality of first gas injectors are divided into a plurality of individually controllable zones.

9. The chemical vapor deposition reactor as recited in claim 1, wherein each of the second gas injectors in each of the zones are individually controllable.

10. The chemical vapor deposition reactor as recited in claim 1, wherein the plurality of first gas injectors are individually controllable.

11. The chemical vapor deposition reactor as recited in claim 1, further comprising:

a floor positioned between the third side and the fourth side, the rotatable wafer carrier being positioned within the floor and being arranged so as to have a top surface that is level with a top surface of the floor.

12. The chemical vapor deposition reactor as recited in claim 1, wherein the plurality of zones is arranged in longitudinal rows.

13. The chemical vapor deposition reactor as recited in claim 1, wherein the plurality of zones is arranged in transverse rows.

14. The chemical vapor deposition reactor as recited in claim 1, wherein the plurality of zones is arranged in a checkerboard row pattern.

15. A chemical vapor deposition reactor comprising: a deposition chamber having a generally rectangular cross-section;

controllable means for injecting a first gas at one end of the chamber, wherein the controllable means for injecting a first gas are configured to provide a controlled flow distribution of the first gas such that the first gas flows through the chamber;

controllable means for injecting a second gas into the chamber through a top of the chamber, wherein the controllable means for injecting a second gas are grouped into a plurality of zones arranged in rows and each of the zones are individually controllable; and a plurality of means for removing gas formed at another end of the chamber.

16. The chemical vapor deposition reactor as recited in claim 15, wherein:

the controllable means for injecting a second gas comprises means for injecting a group III gas through the top of the chamber; and the means for injecting a first gas comprise means for injecting NH3 gas at one end of the chamber.

17. The chemical vapor deposition reactor as recited in claim 15, wherein the second gas comprises a group III gas.

18. The chemical vapor deposition reactor as recited in claim 15, wherein the first gas comprises NH3.

19. The chemical vapor deposition reactor as recited in claim 15, wherein the controllable means for injecting a first gas are grouped into a plurality of zones and each of the zones are individually controllable.

20. The chemical vapor deposition reactor as recited in claim 15, wherein each of the controllable means for injecting a second gas are individually controllable.

21. The chemical vapor deposition reactor as recited in claim 15, further comprising:

controllable means for injecting a third gas at the one end of the chamber.

22. The chemical vapor deposition reactor as recited in claim 21 further comprising means for inhibiting premature mixing and reaction between the first gas and the third gas.

23. The chemical vapor deposition reactor as recited in claim 22, wherein the means comprises a partition between the controllable means for injecting a first gas and the controllable means for injecting a third gas.

24. The chemical vapor deposition reactor as recited in claim 22, wherein the means comprises controllable means for injecting a fourth gas, wherein the controllable means for injecting a fourth gas are positioned at the one end of the chamber between the controllable means for injecting a first gas and the controllable means for injecting a third gas.

25. The chemical vapor deposition reactor as recited in claim 15, further comprising means for rotating a plurality of wafers within the chamber.

\* \* \* \* \*